(12) United States Patent
Többen (10) Patent No.: US 7,012,003 B2
(45) Date of Patent: Mar. 14, 2006

(54) MEMORY FOR PRODUCING A MEMORY COMPONENT

(75) Inventor: Dirk Többen, München (DE)

(73) Assignee: Infineon Technologies AG, Munich (DE)

( * ) Notice: Subject to any disclaimer, the term of this patent is extended or adjusted under 35 U.S.C. 154(b) by 24 days.

(21) Appl. No.: 10/480,999

(22) PCT Filed: Jun. 13, 2002

(86) PCT No.: PCT/EP02/06512

§ 371 (c)(1),
(2), (4) Date: Jul. 12, 2004

(87) PCT Pub. No.: WO02/103799

PCT Pub. Date: Dec. 27, 2002

(65) Prior Publication Data

US 2005/0020009 A1    Jan. 27, 2005

(30) Foreign Application Priority Data

Jun. 18, 2001   (DE) ............................... 101 28 933

(51) Int. Cl.
*H01L 21/336* (2006.01)

(52) U.S. Cl. ............... 438/257; 438/258; 438/264; 438/265; 438/266; 438/593; 257/314; 257/315; 257/316

(58) Field of Classification Search ........ 438/257–258, 438/264–266, 296; 257/314–316
See application file for complete search history.

(56) References Cited

U.S. PATENT DOCUMENTS 5,289,422 A   2/1994   Mametani
5,661,053 A *  8/1997   Yuan ........................... 438/257

* cited by examiner

*Primary Examiner*—Dung A. Le
(74) *Attorney, Agent, or Firm*—Morrison & Foerster LLP (57) ABSTRACT

The invention relates to a method for producing a memory component comprising a memory location (104) having memory cells and first control electrode strips (162) for controlling the individual memory cells, and a peripheral area (106) having peripheral elements and second control electrode strips (164) for controlling said peripheral elements. The inventive method enables the expansion of the second control electrode strips (164) in the peripheral area (106) to be approximately randomly adjusted to minimum line widths, without influencing or changing the expansion of the first control electrode strips (162) in the memory location (104).

24 Claims, 6 Drawing Sheets

MEMORY FOR PRODUCING A MEMORY COMPONENT

CLAIM FOR PRIORITY

This application claims priority to PCT/EP02/06512, published in the German language on Dec. 27, 2002, which claims the benefit of priority to German Application No. 101 28 933.2, filed in the German language on Jun. 18, 2001.

TECHNICAL FIELD OF THE INVENTION

The present invention relates to a method for producing a memory component, and in particular to a method for producing a dynamic random access memory.

BACKGROUND OF THE INVENTION

The speed or performance of an integrated circuit is greatly dependent on the smallest control electrode length or gate length of an insulated transistor that can be reliably realized. The magnitude of the control electrode length may be subject to technological boundary conditions which limit said length. In a dynamic random access memory (DRAM), both a memory cell region or cell array and a peripheral region have to be produced in a process sequence. The memory cell region comprises control electrode tracks or gate conductor tracks for field-effect selection transistors which are assigned to memory cells, and gaps between the control electrode tracks having a specific distance (on pitch). By contrast, the peripheral region comprises the driving logic and clock generation, etc. for the memory cells in the memory cell region and/or another logic and usually likewise field-effect transistors with control electrode tracks and gaps between the control electrode tracks. Since it is necessary to effect optimization to the memory cell region in particular with regard to the control electrode lithography, however, the minimum insulated line width of a control electrode track of a transistor in the peripheral region cannot be chosen freely. This has the effect that a dynamic random access memory or an embedded dynamic random access memory which comprises both a memory cell region and a peripheral region is at a disadvantage with regard to the performance of the peripheral region compared with a pure logic circuit in which the entire lithography can be concentrated on the smallest insulated control electrode track. However, since the demands with regard to the performance of memory components, such as e.g. dynamic random access memories (DRAMs), are also increasing, improvements which are suitable for production and improve the performance of the transistors in the peripheral region of memory components are desirable.

In the figures, reference symbols which differ only in respect of the first numeral designate identical or functionally identical constituent parts.

Figure 2A:
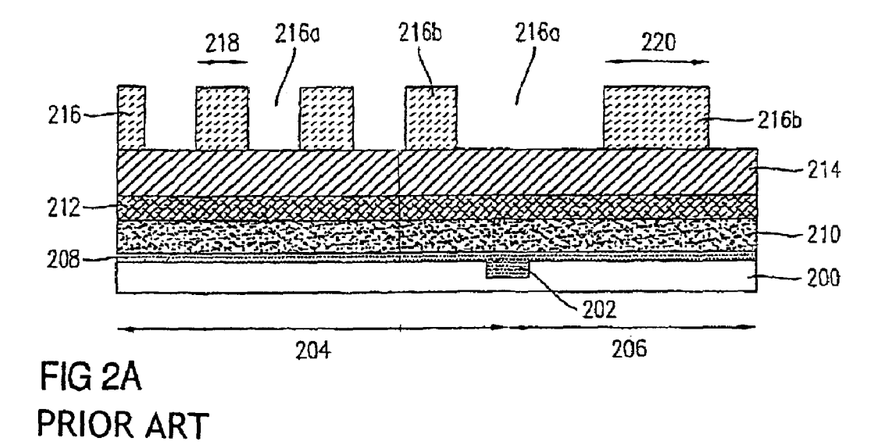

FIG. 2 shows a known method for producing a memory component, and in particular the method for patterning the control electrode plane for a DRAM. FIG. 2A shows a substrate 200, in which there are already situated parts, such as e.g. wells, etc., of the later memory components and insulations 202 which divide the substrate 200 into a memory cell region 204 and a peripheral region 206. A control electrode oxide layer 208 or a gate oxide layer is applied on the substrate 200. A layer stack comprising a polysilicon layer 210, which is usually n-doped, and a tungsten silicide ($WSi_x$) layer 212 for increasing the conductivity is applied on the control electrode oxide layer 208. A patterning layer 214 or a cap layer made of silicon nitride (SiN) is applied on the layer stack. The patterning layer 214 is very important for patterning in the memory cell region 204, and there in particular for the production of the bit line contacts, which are not discussed in any further detail. In contrast to a logic circuit which is not divided into memory cell region and peripheral region, however, attention shall be drawn explicitly to the need for said patterning layer, even if the latter is rather disturbing in the peripheral region of a memory component. A resist mask 216 applied on the patterning layer 214 is patterned by means of photolithography, in such a way that it has open regions 216a and closed regions 216b. As already mentioned above, in the memory cell region 204, optimization is effected to the dimension of the line width 218 of a control electrode track in the memory cell region 204. The minimum line width 220 of a closed region 216b of the resist mask 216 which is assigned to an insulated control electrode track in the peripheral region 206 is then defined by the illumination conditions and the material parameters of the resist mask 216.

Figure 2B:
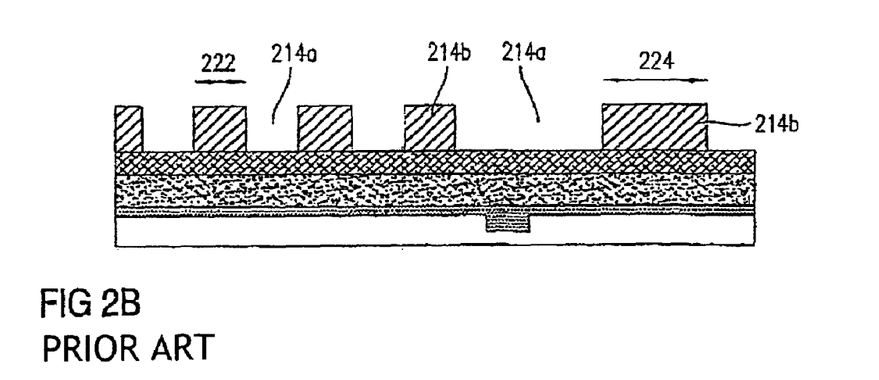

FIG. 2B shows that the patterning layer 214 is etched selectively with respect to the tungsten silicide layer 212, and the resist mask 216 is removed. The patterning layer 214 has open regions 214a and closed regions 214b equivalent to the resist mask 216. The etching changes the line width 218 of the closed regions 214b in the memory cell region 204, which are assigned to the control electrode tracks in the memory cell region 204, to a line width 222 and the line width 220 of the closed regions 214b in the peripheral region 206, which are assigned to control electrode tracks in the peripheral region 206, to a line width 224, which is referred to as the etching deviation or the etching bias of the mask opening step for opening the mask in the patterning layer 214.

Figure 2C:
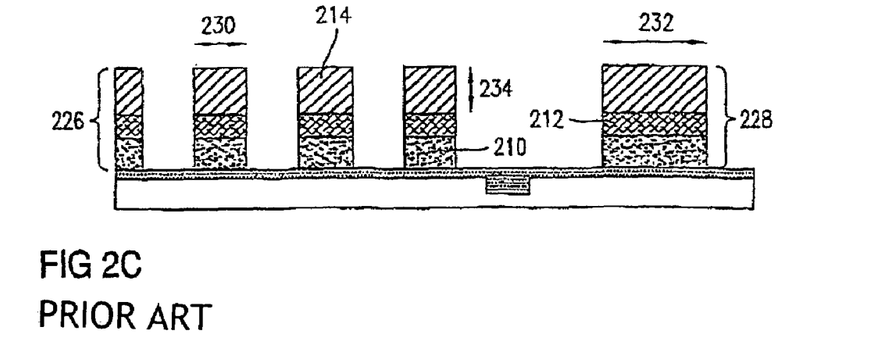

FIG. 2C shows control electrode tracks 226 or control electrode stacks (gate stacks) for driving individual memory cells in the memory cell region 204 and control electrode tracks 228 for driving peripheral elements in the peripheral region 206 after the structures of the patterning layer 214 have been transferred to the layer stack of the polysilicon layer 210 and the tungsten silicide layer 212. The patterned patterning layer 214 was used as a hard mask for patterning the polysilicon layer 210 and the tungsten silicide layer 212. This control electrode etching step is designed in such a way that it stops on the control electrode oxide layer 208. During this method, once again the line width 222 of a closed region 214b assigned to a control electrode track in the memory cell region 204 changes to an actual line width 230 of the control electrode track 226 for driving the individual memory cells in the memory cell region 204, and the line width 224 of a closed region 214b assigned to a control electrode track in the peripheral region 206 changes to an actual line width 232 of the control electrode track 228 for driving the peripheral elements. This change in the line width corresponds to the etching deviation of the control electrode etching step. The change in the line width from FIG. 2B to 2C is small, however, during this step. The thickness of the patterning layer 214 additionally changes during the transfer of the structures, said patterning layer being reduced to a thickness 234 in this case. This change in the thickness is identical for both the memory cell region 204 and the peripheral region 206 after the control electrode track etching, within the bounds of small fluctuations.

Figure 3A:
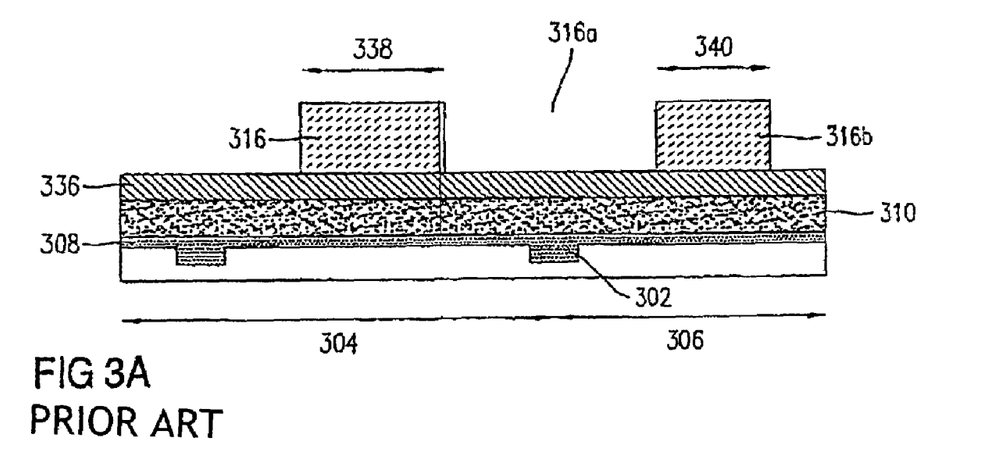

FIG. 3A shows the production of typical control electrode tracks of a pure logic circuit which does not comprise different regions, such as e.g. a memory cell region and a peripheral region. These control electrode tracks differ in several points from the control electrode tracks of a memory component, such as e.g. a DRAM. The layer structure of the control electrode tracks comprises, similarly to FIG. 1, a substrate 300, a control electrode oxide layer 308 applied on the substrate 308, and a polysilicon layer 310 applied on the control electrode oxide layer 308. The polysilicon of polysilicon layer 310 is undoped at this point in time in the method, in order later to be able to realize transistors having n- and p-doped control electrodes or gates. In comparison with the structure of a memory component as shown in FIG. 2, the layer structure shown in FIG. 3 does not have a tungsten silicide layer, since the low resistance of the control electrode tracks can later be achieved by means of saliciding. This is possible in particular because no patterning layer or cap layer made of silicon nitride is used, rather an oxide layer 336 is instead deposited on the polysilicon layer 310, which is later consumed during the method. In the logic circuit shown in FIG. 3, there is no memory cell region in which the smallest insulated track of a control electrode track determines the process window, and the resist and the exposure conditions can be optimized thereto. A resist layer 316 is applied on the oxide layer 336, which resist layer is already patterned and has open regions 316a and closed regions 316b, the closed regions 316b having line widths 338 and 340 assigned to control electrode tracks.

Figure 3B:
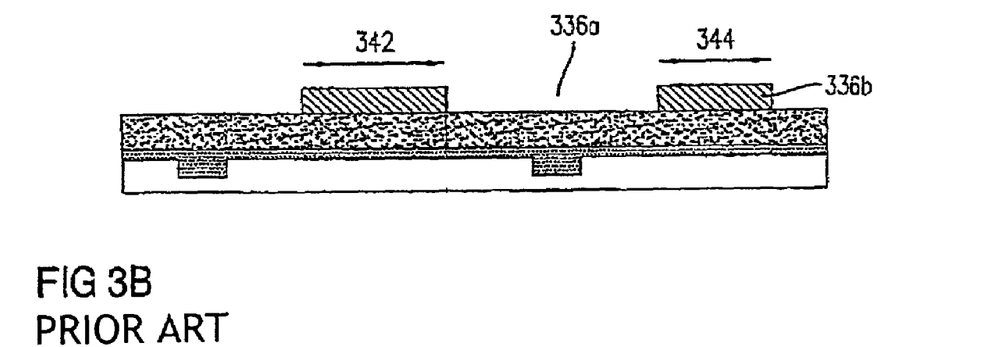

FIG. 3B shows the layer structure after the transfer of the structure of the resist layer 316 to the oxide layer 336 and after the removal of the resist layer 316. During this transfer, open regions 336a and closed regions 336b are produced in the control electrode oxide layer 336, the closed regions 336b having line widths 342 and 344 assigned to control electrode tracks.

Figure 3C:
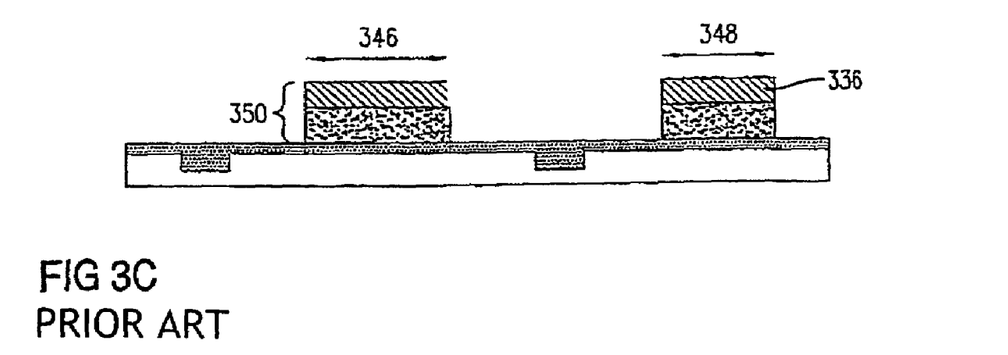

Finally, FIG. 3C shows the layer structure after the transfer of the structure of the oxide layer 336 to the polysilicon layer 310. The line widths 342, 344 of closed regions 336b of the oxide layer 336 are transferred into actual line widths 346, 348 of the control electrode tracks 350 or control stacks. The remaining oxide layer 336 is thinned compared with the original oxide layer shown in FIG. 3A and is removed in later method steps before the saliciding.

Figure 4A:
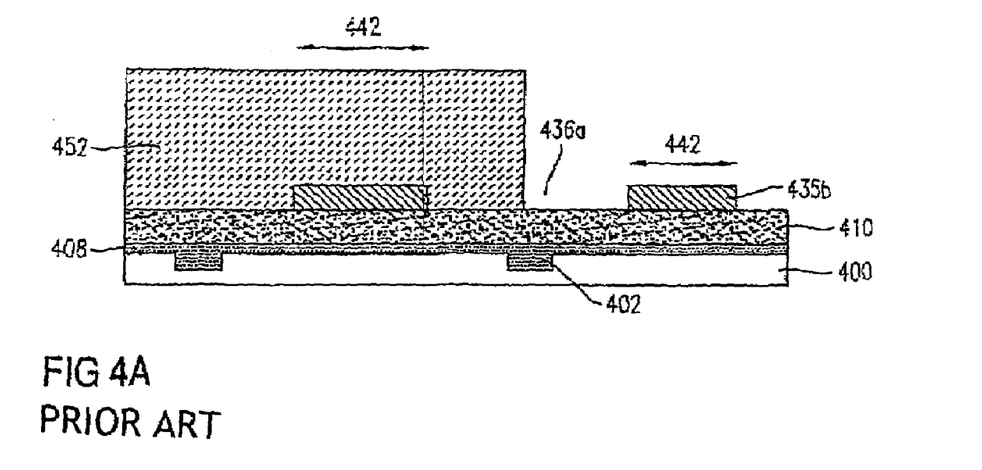

FIG. 4 shows a method for reducing the line width and/or the line length of a control electrode track or a control stack of individual transistors in logic circuits additionally below the lithographically governed minima. The structure shown in FIG. 4A once again has a substrate 400, on which a control electrode oxide layer 408 and a polysilicon layer 410 are applied. The logic circuit is divided into a first region 404 and a second region 406 by insulators 402. There is applied on the polysilicon layer 410 a patterned oxide layer 436 having open regions 436a and closed regions 436b, the structure of which corresponds to the structure shown in FIG. 3B. The closed regions 436b produced in the structure of the oxide layer 436, which are assigned to control electrode tracks, have line widths 442 and 444.

Figure 4B:
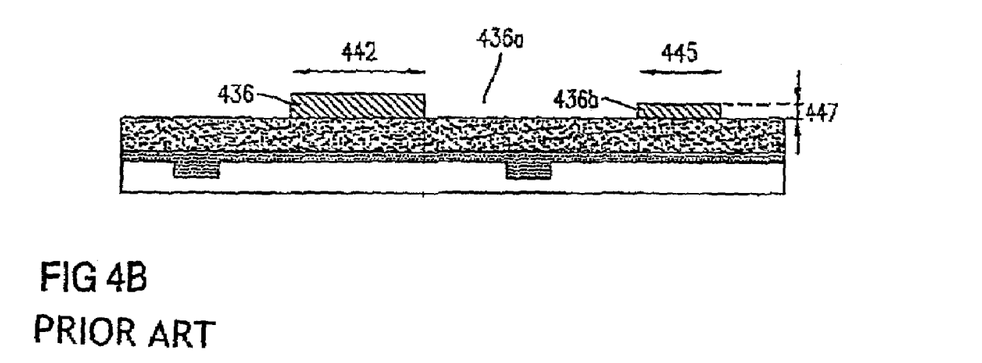

In FIG. 4A, a resist mask 452 is applied on a part of the logic circuit. In order to reduce the line width 444 of a closed region 436b assigned to a control electrode track in FIG. 4A, an isotropic etching is carried out, e.g. in hydrofluoric acid (HF), as a result of which the patterned closed regions 436b of the oxide layer 436 which are not covered by the resist layer 452 are reduced laterally to a line width 445 and vertically to a thickness 447. This step is generally called pull-back. The resist mask 452 is stripped or removed in a next step, e.g. by incineration, and an oxide layer 436 having different local thicknesses remains, which is shown in FIG. 4B. The oxide layer 436 therefore does not form a uniform plane, which may lead to problems e.g. in later polishing methods. Such problems must be avoided in particular in the case of memory components, such as e.g. DRAM memory components. In the case of logic circuits, in contrast to memory components, this is unimportant, however, since the oxide layer 436 has already fulfilled its function and can be removed. In the case of logic circuits, the isotropic etching step may, of course, also be carried out without a resist layer 452, and closed regions 436b assigned to control electrode tracks may simultaneously be diminished.

Figure 4C:
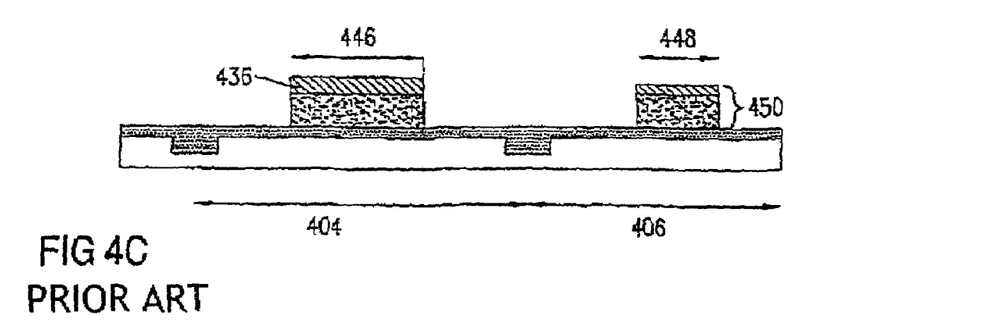

Finally, FIG. 4C shows the transfer of the structure of the oxide layer 436 to the polysilicon layer 410 in order to form control electrode tracks 450 having actual line widths 446 and 448.

A further possibility for realizing cell regions and very narrow insulated control electrode tracks in the control electrode conductor plane consists in a double exposure. This can be applied in principle to memory components, but has the disadvantages of a high outlay and of overlay problems during the exposure of subsequent planes.

Therefore, one disadvantage in the prior art is that, during the production of control electrode tracks for memory components, although the line width of control electrode tracks assigned to memory cells in a memory cell region of a memory component can be optimized optically and in terms of magnitude, at the same time it is possible as a result only to effect a limited reduction of the extent, such as e.g. reduction of the line width, of the control electrode tracks assigned to peripheral elements in a peripheral region of memory components. This problem is due to the fact that peripheral regions of memory components are typically provided with logic circuits, such as e.g. a driving logic or a clock generation, which do not have periodic structures but rather structures that are far away from one another, such as e.g. control electrode tracks, which do not afford any optical support during the exposure of the structures whereby the resolution could be improved and the line width minimized.

A further disadvantage in the prior art is that in alternative methods for setting the extent, such as e.g. the line width of control electrode tracks, in different regions of an integrated circuit, the known methods have the effect that the thickness of a patterning layer, such as e.g. a silicon nitride layer, varies, which leads to problems during later required polishing of the structure of the memory component.

SUMMARY OF THE INVENTION

The present invention discloses a method for producing a memory component which makes it possible to reduce the extent of control electrode tracks in a peripheral region of a memory component without impairing the yield in the production of the memory component.

The invention has the advantage over the known solutions, in particular the known method of FIG. 2, that it is possible to form narrow insulated control electrode tracks or narrow control stacks in a peripheral region of a memory component by using a small number of additional steps after the step of patterning of a patterning layer or after a mask opening etching for the memory component, such as e.g. a dynamic random access memory (DRAM). In this case, the lithography remains untouched and continues to be optimized to the cell region of the memory component. Additionally used layers are removed again in the course of the method according to the invention, so that the final structure achieved is identical to a typical memory component structure, merely with the difference that a reduced line width of the control electrode tracks is achieved in the peripheral region, and that a more greatly reduced but uniform thickness of a patterning layer, such as e.g. a silicon nitride layer, occurs, it being possible for this greater reduction of the thickness to be readily corrected by means of a larger deposition thickness of the patterning layer.

Therefore, a further advantage of the invention is that, during later polishing methods for the memory component, the patterning layer has a uniform thickness, and this therefore cannot lead to damage to the memory component and, therefore, also cannot lead to a reduced yield in the production of the memory component.

A further advantage of the the invention over the known solutions is that the method steps of the invention are known in the production of memory components or from other production methods and the main steps of a production method remain unchanged, which ensures a simplified implementation in existing production methods.

In accordance with one preferred embodiment of the invention, the filling comprises application of the protective material in the memory cell region and the peripheral region.

In accordance with a further preferred embodiment of the invention, the filling comprises the direction-selective removal of the protective material in the first direction, in such a way that the protective material is removed in the first direction from the upper ends of the closed regions of the patterning layers, and the open regions are filled with the protective material in at least the second direction in a manner essentially flush with the upper ends of the closed regions of the patterning layer.

In accordance with a further preferred embodiment of the invention, the filling comprises the application of a second mask layer at least on the memory cell region.

In accordance with a further preferred embodiment of the invention, the filling comprises the removal of the protective material in those regions of the peripheral region which are not covered by the second mask layer, selectively with respect to the patterning layer and the layer stack.

In accordance with a further preferred embodiment of the invention, the filling furthermore comprises removal of the second mask layer.

In accordance with a further preferred embodiment of the invention, the selective setting furthermore comprises partial removal of the patterning layer in the memory cell region and in the peripheral region selectively with respect to the protective material.

In accordance with a further preferred embodiment of the invention, the patterning of the first mask layer comprises patterning by means of photolithography.

In accordance with a further preferred embodiment of the invention, the transfer of the mask structure of the first mask layer to the patterning layer comprises selective etching of the patterning layer.

In accordance with a further preferred embodiment of the invention, the transfer of the structures of the patterning layer to the layer stack comprises selective etching of the layer stack with respect to the insulation layer.

In accordance with a further preferred embodiment of the invention, the layer stack has a control electrode layer and a conductivity increasing layer.

In accordance with a further preferred embodiment of the invention, the provision comprises provision of the insulation layer having insulators which are embedded in the substrate and which isolate the memory cell regions from the peripheral regions.

In accordance with a further preferred embodiment of the invention, the memory component comprises a dynamic random access memory (DRAM).

In accordance with a further preferred embodiment of the invention, the first and second control electrode tracks are gate stacks of MOS field-effect transistors (MOSFETs).

In accordance with a further preferred embodiment of the invention, the substrate comprises silicon.

In accordance with a further preferred embodiment of the invention, the insulation layer comprises silicon oxide.

In accordance with a further preferred embodiment of the invention, the control electrode layer comprises polysilicon.

In accordance with a further preferred embodiment of the invention, the conductivity increasing layer comprises tungsten silicide ($WSi_x$).

In accordance with a further preferred embodiment of the invention, the patterning layer comprises SiNx.

In accordance with a further preferred embodiment of the invention, the first and/or the second mask layer comprise a resist layer.

In accordance with a further preferred embodiment of the invention, the protective layer comprises an oxide.

In accordance with a further preferred embodiment of the invention, the oxide is formed by means of a subatmospheric chemical vapor deposition (SACVD) or a low pressure chemical vapor deposition (LPCVD).

In accordance with a further preferred embodiment of the invention, the removal of the protective material in that region of the peripheral region which are not covered by the second mask layer comprises removal of the protective material using hydrofluoric acid (HF).

In accordance with a further preferred embodiment of the invention, the partial removal of the patterning layer comprises removal of the patterning layer using a mixture of hydrofluoric acid (HF) and ethylene glycol (EG).

BRIEF DESCRIPTION OF THE DRAWINGS

Preferred exemplary embodiments of the present invention are explained in more detail below with reference to the accompanying drawings.

In the figures:

FIG. 1 shows a preferred exemplary embodiment of a method for producing a memory component.

FIG. 2 shows a known method for producing a memory component.

FIG. 3 shows a known method for producing a logic circuit.

FIG. 4 shows a further known method for producing a logic circuit.

In the figures, identical reference symbols which differ only in the first numeral designate identical or functionally identical constituent parts.

DETAILED DESCRIPTION OF THE INVENTION

FIG. 1 shows a first preferred exemplary embodiment of a method for producing a memory component. The memory component is preferably a dynamic random access memory (DRAM) and generally comprises a memory cell region and a peripheral region. The memory cell region comprises memory cells, such as e.g. of a dynamic random access memory, and first control electrode tracks or control stacks for driving the individual memory cells. By contrast, the peripheral region comprises peripheral elements, comprising for example a driving logic, clock generation logic or similar logic for the memory cells, and second control electrode tracks or second control stacks for driving the peripheral elements. The first and second control electrode tracks are preferably control stacks or gate stacks of MOS field-effect transistors (MOSFETS; MOSFET=Metal Oxide Semiconductor Field Effect Transistor).

With reference to FIG. 1, in a first step S1 of the method for producing a memory component, provision is made of as substrate 100, preferably a substrate comprising silicon, having memory cell structures. On the substrate 100, an insulation layer 108, which preferably comprises silicon oxide and serves for forming the insulation layer of a field-effect transistor, is applied in a first direction. On the insulation layer 108, furthermore, a layer stack which forms a part of each control electrode track or of each control stack in the memory cell region and the peripheral region is applied in the first direction. The layer stack preferably has a control electrode layer 110, comprising polysilicon for example, and a conductivity increasing layer 112, which is applied on the control electrode layer 110 in the first direction and preferably comprises tungsten silicide ($WSi_x$). Finally, a patterning layer 114, preferably comprising silicon nitride ($SiN_x$), is arranged in the first direction on the layer stack 110, 112. The step S1 of provision of the substrate 100, the insulation layer 108 and the layer stack 110, 112 furthermore comprises the provision of insulators 102 which are embedded in the substrate 100 and isolate the memory cell regions 104 from the peripheral regions 106.

In a second step S2 of the method for producing a memory component, a first mask layer 116 is applied on the patterning layer 114 in the first direction. The first mask layer preferably has a resist layer, which can be patterned by photolithography.

Figure 1A:
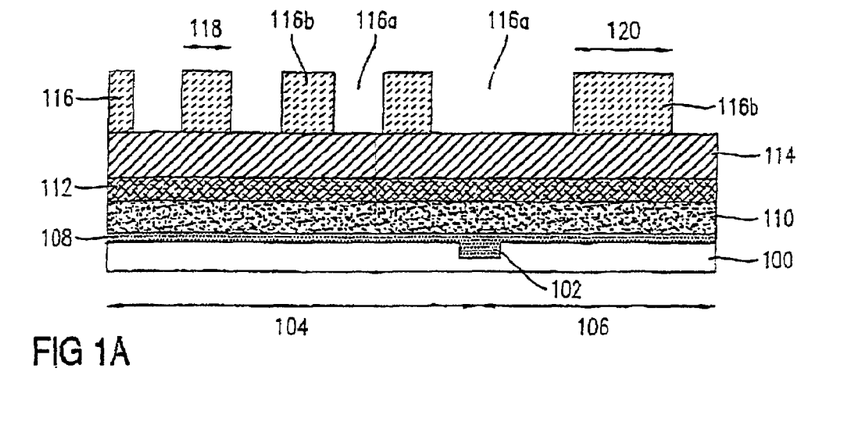

FIG. 1A shows the structure of the memory component after a third step S3 of the method according to the present invention. The third step comprises the step of patterning of the first mask layer 116 in the first direction, the first mask layer 116 then comprising, in the memory cell region 104 and the peripheral region 106, closed regions 116b, in which the first mask layer 116 is not removed and which are assigned to the first and second control electrode tracks or the first and second control stacks, and open regions 116a, such as e.g. gaps between the control electrode tracks, in which the first mask layer 116 is removed, in at least one second direction perpendicular to the first direction. The patterning step preferably comprises the patterning of the first mask layer 116 by means of a photolithography. After this third step S3, closed regions 116b assigned to the control electrode tracks in the memory cell region 104 have a line width 118, and closed regions 116b assigned to control electrode tracks in the peripheral region 106 have a line width 120.

Figure 1B:
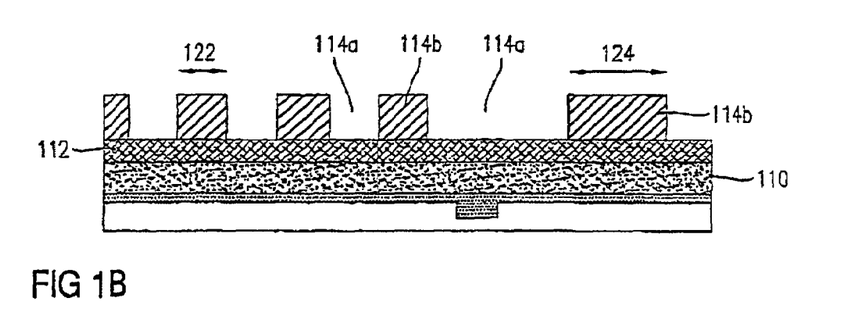

FIG. 1B shows a fourth and fifth step of the method according to the present invention, in which case, in the fourth step S4, the mask structure of the first mask layer 116 is transferred to the patterning layer 114 in the first direction in such a way that the structure of the patterning layer 114 corresponds to the mask structure and therefore likewise comprises open regions 114a and closed regions 114b. The step of transfer of the mask structure of the first mask layer 116 to the patterning layer 114 preferably comprises the step of selective etching of the patterning layer 114. Up to this fourth step S4 of the method of transfer of the mask structure to the patterning layer, the method is identical to the known method for producing a memory component as described in FIG. 2.

In the fifth step (S5) of the method of the present invention, the mask layer 116 is removed, which finally leads to the structure shown in FIG. 1B, in which the closed regions 114b of the patterning layer 114 have a line width 122 in the memory cell region 104 and a line width 124 in the peripheral region 106, which are assigned to the first and second control electrode tracks or control stacks.

Figure 1C:
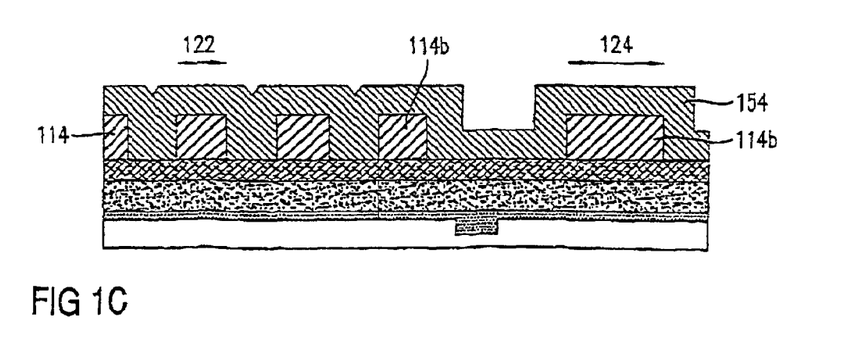
Figure 1D:
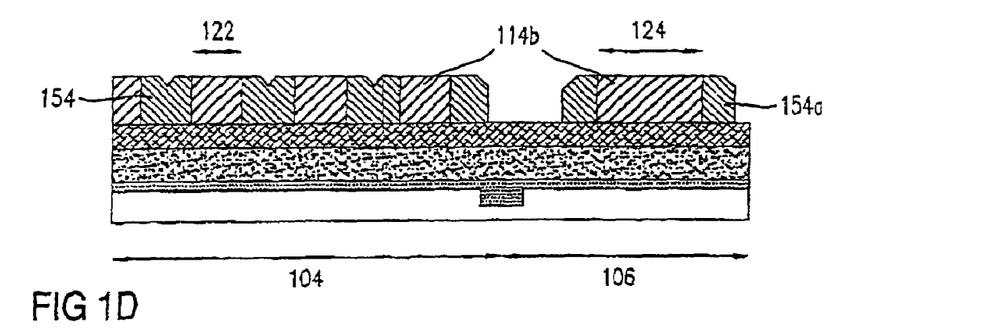
Figure 1E:
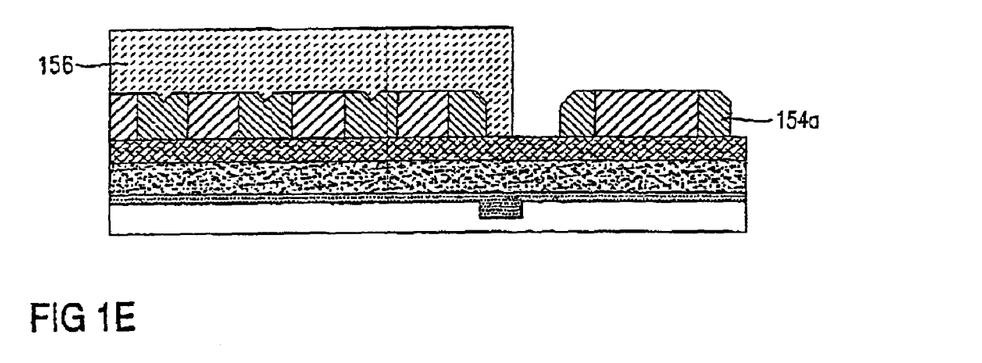
Figure 1F:
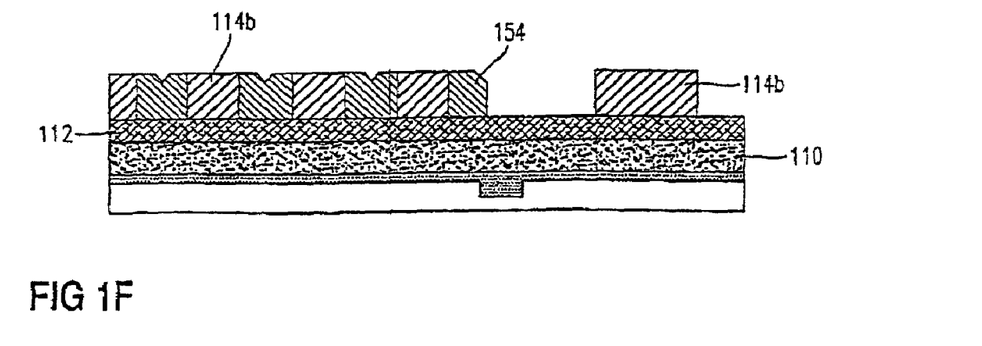

FIGS. 1C to 1F show a sixth step S6 of the method according to the present invention, in which the open regions 114a (FIG. 1B) of the patterning layer 114, which are assigned to gaps between control electrode tracks, are filled with a protective material 154 in at least the memory cell region 104, in such a way that the open regions 114a are filled with the protective material 154 in the second direction in a manner essentially flush with the patterning layer 114 (FIG. 1F). The protective material 154 preferably comprises an oxide formed for example by means of a subatmospheric chemical vapor deposition (SACVD) or a low pressure chemical vapor deposition (LPCVD).

FIG. 1C shows a first substep S61 of the sixth step S6 of the method according to the present invention, in which the protective material 154 is applied in the memory cell region 104 and the peripheral region 106 in order to fill or overfill the open regions 114a (FIG. 1B) of the patterning layer 114, which are assigned to gaps between control electrode tracks, between the closed regions 114b of the patterning layer 114, which are assigned to control electrode tracks, with the protective material 154 and to cover the closed regions 114b themselves with the protective material 154.

FIG. 1D shows a second substep S62 of the sixth step S6 of filling, in which the protective material 154 is removed direction-selectively in the first direction in such a way that the protective material 154 is removed in the first direction from the upper ends of the closed regions 114b, which are assigned to the control electrode tracks of the memory cells or peripheral elements, of the patterning layer 114, and the open regions 114a (FIG. 1B) between the closed regions 114b are filled with protective material 154 in at least the second direction in a manner essentially flush with the closed regions (114b) of the patterning layer 114. This step is called carrying out a spacer etching, after which the patterning layer 114 is free again from above and spacers 154a comprising the protective material 154 are formed in regions, here the peripheral region 106, at the sidewalls of the closed regions 114b, the spacers 154a being altered only slightly at the corners, e.g. as a result of etching, by the step of direction-selective removal.

FIG. 1E shows a third substep S63 of the step S6 of filling, in which a second mask layer 156 is applied in the first direction on at least the memory cell region 104. The second mask layer 156 preferably comprises a resist layer.

FIG. 1F shows a fourth substep S64 of the step S6 of filling, in which the protective material 154, here the spacers 154a, is removed selectively with respect to the patterning layer 114 and the layer stack 110, 112 in those regions of the peripheral region 106 which are not covered by the second mask layer 156. This is preferably carried out by using hydrofluoric acid (HF). In contrast to the known method for producing a logic circuit as described in FIG. 4, a pull-back of the closed regions 114b in the peripheral region 106, which are assigned to second control electrode tracks, does not take place here. After the removal of the protective material 154 in the peripheral region 106, the second mask layer 156 is removed, preferably by stripping or incineration, in such a way that there remain firstly a memory cell region 104 filled with the protective layer 154 and having filled open regions of the patterning layer 114, which are assigned to gaps between first control electrode tracks, secondly specific structures in the peripheral region 106 which comprise the protective layer 154 in the form of spacers 154a (FIG. 1D) at the sidewalls (not shown), and thirdly, in particular, closed regions 114b in the peripheral region 106, which are assigned to second control electrode tracks, which are closed regions 114b of the patterning layer 114 that have been completely freed of the protective layer 154. It should be noted that the line widths 122 and 124 of the closed regions 114b assigned to the control electrode tracks do not change during the substeps S61 to S64 of the sixth step S6.

In a seventh step S7 of the method for producing a memory component according to the present invention, the extent, such as e.g. the line width 158, of closed regions 114b of the patterning layer 114 in the peripheral region 106, in at least the second direction, i.e. in the width direction and/or in the longitudinal direction, is set selectively, in such a way that only the extent of closed regions 114b of the patterning layer 114 which are bounded by at least one open region 114a of the patterning layer 114 is set, said open region comprising no protective material 154 at least adjoining a closed region 114b. In this case, the protective material 154 is present either as spacer 154a at the sides of a closed region 114b or as filling 154b between two closed regions 114b of the patterning layer 114 (FIG. 1G).

Figure 1G:
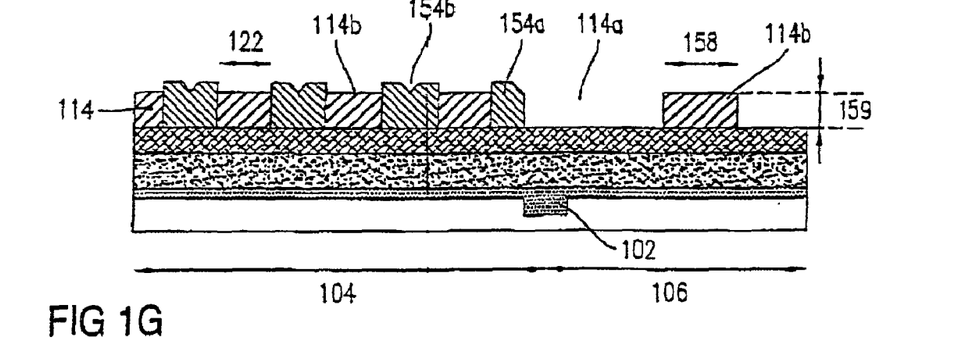

FIG. 1G shows a substep S71 of the step (S7) of selective setting, in which the patterning layer 114 is removed selectively with respect to the protective material 154 in the memory cell region 104 and in the peripheral region 106. In this case, in the memory cell region 104, the closed regions 114b of the patterning layer 114, which are assigned to the first control electrode tracks, are protected from removal by the protective layer 154 at the sides and thereby maintain their line width 122. By contrast, the closed regions 114b of the patterning layer 114, which are assigned to control electrode tracks, are not protected by the protective layer 154, such as e.g. spacers 154a (FIG. 1E), in the peripheral region 106, as a result of which the line width of the closed regions 114b is reduced from the line width 124 of FIG. 1D to a line width 158. A mixture of hydrofluoric acid (HF) and ethylene glycol (EG) is preferably used in the step of partial removal of the patterning layer 114 in FIG. 1G.

It should be noted that, for all the closed regions 114b of the patterning layer 114, the thickness 159 thereof is reduced uniformly, in which case it does not matter, however, whether a closed region 114b in the memory cell region 104 or in the peripheral region 106 is involved. Therefore, the thickness does not vary from the memory cell region 104 to the peripheral region 106 and, consequently, no problems arise during a subsequent polishing step for the memory component. The lateral dimensions are preserved for those closed regions 114b which are flanked by spacers 154a or fillings 154b of the protective layer 154, that is to say in particular in the memory cell region 104, because although an HF/EG mixture also slightly attacks for example the oxide used for the protective layer 154, which is shown by the beveled corners of the spacers 154a in FIG. 1G, this takes place with a significantly lower etching rate than the patterning layer 114, which preferably comprises SiN. As a result, the closed regions 114b in the peripheral region 106, from which the spacers 154a were etched away in the preceding sixth step, are reduced by approximately twice the thickness reduction. This seventh step of the method is therefore referred to as a pull-back step.

Figure 1H:
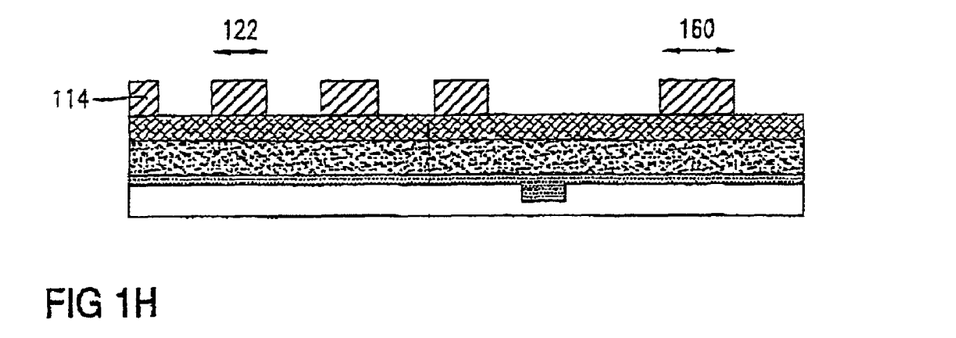

FIG. 1H shows an eighth step S8 of the method of the present invention, in which the protective material 154 is removed selectively with respect to the patterning layer 114 and the layer stack 110, 112 in the memory cell region 104 and in the peripheral region 106. If the resulting line width 160 of the closed regions in the peripheral region 106, which are assigned to second control electrode tracks, is compared with the line width 224 of the patterning layer 114 as shown in FIG. 2B, the great reduction of the line width in the peripheral region is evident, which considerably improves the performance of the logic circuits in this region.

Figure 1I:
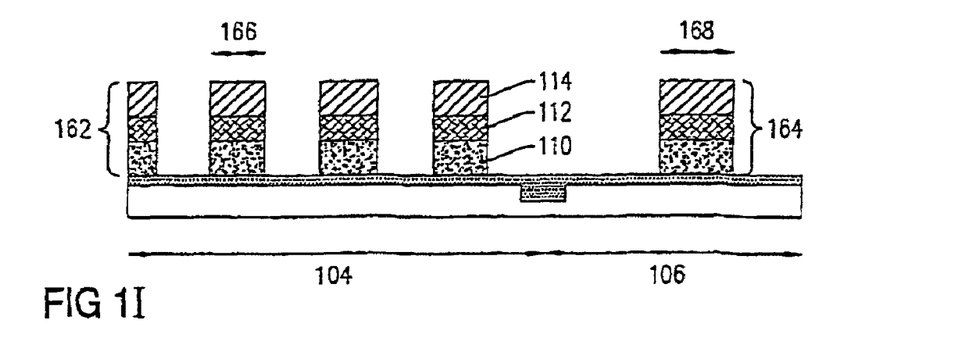

Finally, FIG. 1I shows a ninth step S9 of the method of the present invention, in which the structure of the patterning layer 114 is transferred to the layer stack 110, 112 in the first direction in order to produce the first control electrode tracks 162 or first control stacks, which are assigned to the memory cell region 104, and the second control electrode tracks 164 or second control stacks, which are assigned to the peripheral region 106. The first control electrode track 162 and the second control electrode track 164 have the layer stack 110, 112 and the patterning layer 114 and an identical thickness. The step of transfer of the structures of the patterning layer 114 to the layer stack 110, 112 preferably comprises the step of selective etching of the layer stack with respect to the insulation layer 108.

FIGS. 1H and 1I correspond to FIGS. 2B and 2C of the known method for producing a memory component. In the method according to the present invention, the thickness of the patterning layer 114 is reduced admittedly to a greater degree, but in return uniformly, in comparison with the known method by means of the step of setting of the width of the closed regions in the peripheral region 106 as shown in FIG. 1G. However, this greater reduction of the thickness can can [sic] readily be compensated for by a thicker original deposition of the patterning layer 114.

The method described in FIGS. 1A–1I can be extended to the effect that it is possible to carry out a number of times the steps of application of a second mask layer 156, i.e. the substep S63 of FIG. 1E, and partial removal of the patterning layer 114 in the peripheral region, i.e. the substep S71 of FIG. 1G, without opening the memory cell region by removal of the second mask layer 156, the second mask layer 156 respectively opening other regions of the peripheral region 106. It is furthermore conceivable for the entire step sequence from the step of filling of the open regions of the patterning layer 114 with the protective material 154, i.e. the substep S61 of FIG. 1C, up to the step of removal of the protective material 154, i.e. the step S6, to be implemented a number of times in order to optimize the line width reduction of the control electrode tracks to different peripheral regions 106.

Although the present invention has been described above on the basis of a preferred exemplary embodiment, it is not restricted thereto but rather can be modified in diverse ways.

List of Reference Symbols:
100 Substrate
102 Insulations
104 Memory cell region
106 Peripheral region
108 Insulation layer
110 Control electrode layer
112 Conductivity increasing layer
114 Patterning layer
114a Open regions of 114
114b Closed regions of 114
116 First mask layer
116a Open regions of 116
116b Closed regions of 116
118 Line width of 116b in 104
120 Line width of 116b in 106
122 Line width of 114b in 104
124 Line width of 114b in 106

154 Protective material
154a Spacer made of 154
154b Fillings made of 154
158 Line width of 114b in 106
159 Thickness of 114
160 Line width of 114b in 106
162 First control electrode track
164 Second control electrode track
166 Line width of 162
168 Line width of 164
200 Substrate
202 Insulation
204 Memory cell region
206 Peripheral region
208 Control electrode oxide layer
210 Polysilicon layer
212 Tungsten silicide layer
214 Patterning layer
214a Open regions of 214
214b Closed regions of 214
216 Resist mask
216a Open regions of 216
216b Closed regions of 216
218 Line width of 216b in 204
220 Line width of 216b in 206
222 Line width of 214b in 204
224 Line width of 214b in 206
226 Control electrode track in 204
228 Control electrode track in 206
230 Line width of 226
232 Line width of 228
234 Thickness of 214
300 Substrate
302 Insulation
304 Memory cell region
306 Peripheral region
308 Control electrode oxide layer
310 Polysilicon layer
316 Resist layer
316a Open regions of 316
316b Closed regions of 316
336 Oxide layer
336a Open regions in 336
336b Closed regions in 336
338 Line width of 316b in 304
340 Line width of 316b in 306
342 Line width of 336b in 304
344 Line width of 336b in 306
346 Line width of 350 in 304
348 Line width of 350 in 306
400 Substrate
402 Insulation
404 First region
406 Second region
408 Control electrode oxide layer
410 Polysilicon layer
436 Oxide layer
436a Open regions in 436
436b Closed regions in 436
442 Line width of 436b in 404
444 Line width of 436b in 406
445 Line width of 436b in 406
446 Line width of 450 in 404
447 Thickness of 436 in 406
448 Line width of 450 in 406

What is claimed is:

1. A method for producing a memory component comprising a memory cell region having memory cells and first control electrode tracks for driving individual memory cells and a peripheral region having peripheral elements and second control electrode tracks for driving the peripheral elements, comprising:
   applying, in a first direction, to a provision of a substrate having memory cell structures, an insulation layer, a layer stack and a patterning layer;
   applying a first mask layer on the patterning layer in the first direction;
   patterning the first mask layer in the first direction, the first mask layer comprising, in the memory cell region and the peripheral region, closed regions, in which the first mask layer is not removed and which are assigned to the first and second control electrode tracks, and open regions, in which the first mask layer is removed, in at least one second direction perpendicular to the first direction;
   transferring the mask structure of the first mask layer to the patterning layer in the first direction, such that the structure of the patterning layer corresponds to the mask structure;
   removing the first mask layer;
   filling open regions of the patterning layer in at least the memory cell region with a protective material, such that the open regions are filled with the protective material in the second direction in a manner essentially flush with the patterning layer;
   selectively setting the expansion of closed regions of the patterning layer in the peripheral region in at least the second direction, such that the expansion of closed regions bounded by at least one open region of the patterning layer, the open region having no protective material, is set;
   removing the protective material in the memory cell region and in the peripheral region selectively with respect to the patterning layer and the layer stack;
   transferring the structures of the patterning layer in the first direction to the layer stack to produce the first and the second control electrode tracks.

2. The method as claimed in claim 1, in which the filling comprises:
   applying the protective material in the memory cell region and the peripheral region.

3. The method as claimed in claim 2, in which the filling further comprises:
   direction-selective removing the protective material in the first direction, such that the protective material is removed in the first direction from the upper ends of the closed regions of the patterning layer, and the open regions are filled with the protective material in at least the second direction in a manner essentially flush with the upper ends of the closed regions of the patterning layer.

4. The method as claimed in claim 3, in which the filling further comprises:
   applying a second mask layer at least on the memory cell region.

5. The method as claimed in claim 4, in which the filling further comprises:
   removing the protective material in the regions of the peripheral region which are not covered by the second mask layer, selectively with respect to the patterning layer and the layer stack.

6. The method as claimed in claim 5, in which the filling further comprises:
removing the second mask layer.

7. The method as claimed in claim 5, in which removing the protective material in the regions of the peripheral region which are not covered by the second mask layer comprises removing the protective material using hydrofluoric acid.

8. The method as claimed in claim 1, in which the selectively setting further comprises:
partially removing the patterning layer in the memory cell region and in the peripheral region selectively with respect to the protective material.

9. The method as claimed claim 8, in which partially removing the patterning layer comprises removing the patterning layer using a mixture of hydrofluoric acid and ethylene glycol.

10. The method as claimed in claim 1, in which the patterning of the first mask layer comprises patterning by means of photolithography.

11. The method as claimed in claim 1, in which the transfer of the mask structure of the first mask layer to the patterning layer comprises selectively etching the patterning layer.

12. The method as claimed in claim 1, in which the transfer of the structures of the patterning layer to the layer stack comprises selectively etching the layer stack with respect to the insulation layer.

13. The method as claimed in claim 1, in which the layer stack has a control electrode layer and a conductivity increasing layer.

14. The method as claimed in claim 13, in which the control electrode layer comprises polysilicon.

15. The method as claimed in claim 13, in which the conductivity increasing layer comprises tungsten silicide.

16. The method as claimed in claim 13, in which the patterning layer comprises silicon nitride.

17. The method as claimed in claim 13, in which the first and/or the second mask layer comprise a resist layer.

18. The method as claimed in claim 1, in which the provision comprises:
a provision of the insulation layer having insulators which are embedded in the substrates and which isolate the memory cell regions from the peripheral regions.

19. The method as claimed in claim 1, in which the memory component comprises a dynamic random access memory.

20. The method as claimed in claim 1, in which the first and second control electrode tracks comprise gate stacks of MOS field-effect transistors.

21. The method as claimed in claim 1, in which the substrate comprises silicon.

22. The method as claimed in claim 1, in which the insulation layer comprises silicon oxide.

23. The method as claimed in claim 1, in which the protective layer comprises an oxide.

24. The method as claimed in claim 23, in which the oxide is formed by means of a subatmospheric chemical vapor deposition or a low pressure chemical vapor deposition.

* * * * *